United States Patent [19]

Saitoh

[11] Patent Number: 5,345,673
[45] Date of Patent: Sep. 13, 1994

[54] METHOD OF MANUFACTURING A PRINTED WIRING BOARD

[76] Inventor: Yoshitaka Saitoh, 8-34, Nishikahei 2-chome, Adachi-ku, Tokyo, Japan

[21] Appl. No.: 163,569

[22] Filed: Dec. 8, 1993

Related U.S. Application Data

[63] Continuation of Ser. No. 73,608, Jun. 7, 1993, abandoned, which is a continuation of Ser. No. 982,146, Nov. 25, 1992, abandoned, which is a continuation of Ser. No. 896,729, Jun. 9, 1992, abandoned, which is a continuation of Ser. No. 784,688, Oct. 30, 1991, abandoned, which is a continuation of Ser. No. 379,435, Jul. 12, 1989, abandoned.

[51] Int. Cl.$^5$ ............................................. H05K 3/02
[52] U.S. Cl. ....................................... 29/846; 174/261; 361/748; 361/750
[58] Field of Search ................... 29/846, 825; 427/96; 174/261; 428/901; 156/901, 902

[56] References Cited

U.S. PATENT DOCUMENTS 3,619,899 11/1971 Takeda et al. .
5,195,238 3/1993 Kawakami et al. .................... 29/846

FOREIGN PATENT DOCUMENTS 63-142889 6/1988 Japan ..................................... 29/846

Primary Examiner—Carl J. Arbes
Attorney, Agent, or Firm—Bruce L. Adams; Van C. Wilks

[57] ABSTRACT

A method of manufacturing a printed wiring board is disclosed. The method comprises the steps of forming a printed circuit on a substrate, coating an insulating layer on at least a part of the printed circuit, coating a shield layer on at least a part of the insulating layer, and forming the shield layer by a halftone dot.

6 Claims, 1 Drawing Sheet

METHOD OF MANUFACTURING A PRINTED WIRING BOARD

This is a continuation of application Ser. No. 073,608 filed Jun. 7, 1993 now abandoned which is a continuation of application Ser. No. 982,146 filed Nov. 25, 1992, now abandoned which is a continuation of application Ser. No. 896,729 filed Jun. 9, 1992, now abandoned which is a continuation of application Ser. No. 784,688 filed Oct. 30, 1991, now abandoned which is a continuation of application Ser. No. 379,435 filed Jul. 12, 1989 now abandoned.

BACKGROUND OF THE INVENTION

The present invention relates to a method of manufacturing a printed wiring board, more particularly, to a printed wiring board in which a printed circuit is formed on a substrate, an insulating layer is coated on at least a part of the printed circuit, a shield layer is coated on at least a part of the insulating layer.

Such a printed wiring or circuit board is well known from, for example, the Japanese Utility Model Application Publication No. 29,276/80. In this case, the shield layer is usually obtained by coating copper paste over desired portions of the insulating layer.

The coating of the above shield layer is performed by coating the copper paste substantially over the whole surface of the insulating layer with a screen process printing, so that the new provision of a mask for printing may be omitted. However, this method must increase the desired amount of the copper paste so that heat dissipation of the printed circuit board becomes decreased and the shield layer is susceptible to cause cracks in the drying process.

SUMMARY OF THE INVENTION

It is an object of the present invention to overcome the above described disadvantages.

It is another object of the present invention to provide a method of manufacturing a printed wiring board in which heat dissipation becomes increased and cracks are not caused in the drying process.

According to the present invention, there is provided a method of manufacturing a printed wiring board which comprises the steps of forming a printed circuit on a substrate, coating an insulating layer on at least a part of the printed circuit, coating a shield layer on at least a part of the insulating layer, and forming the shield layer by a halftone dot.

In a preferred embodiment of the method according to the present invention, the halftone dot is fabricated in a shape of a net formed by a continuous fine strip.

In another feasible version of the method according to the present invention, the halftone dot is fabricated in a shape of a desired pattern formed by a number of dots of discontinuity.

According to the above method of the present invention, the shield layer is formed by a halftone dot, so that the desired amount of the copper paste may be considerably decreased and the average thickness of the copper paste coated on the insulating layer may be decreased, thereby holding excellent heat dissipation and preventing the shield layer from cracking in the drying process. The method according to the present invention requires substantially the same printing labor for the shield layer as that of the conventional method, except for an addition of the halftone dot mask.

BRIEF DESCRIPTION OF THE DRAWINGS

The invention will be described in detail hereinafter with reference to the drawing.

DETAILED DESCRIPTION OF PREFERRED EMBODIMENT

Figure 1:
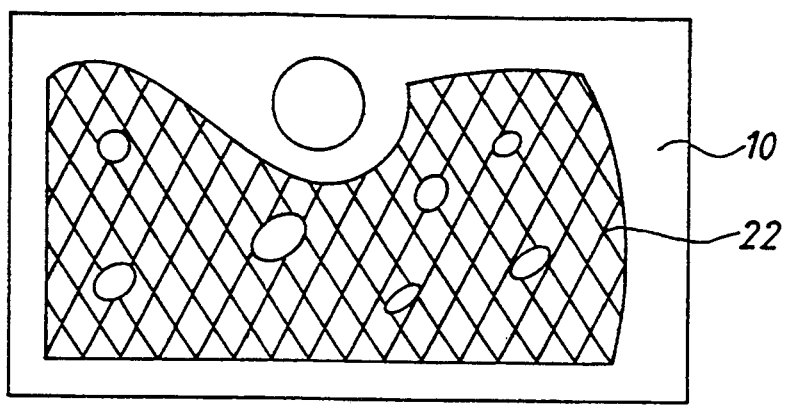
FIG. 1 is a plan view showing a part of a printed wiring board manufactured by the method according to the present invention.

Referring now to the drawing, FIG. 1 shows a part of a printed wiring board according to the present invention.

Figure 2:
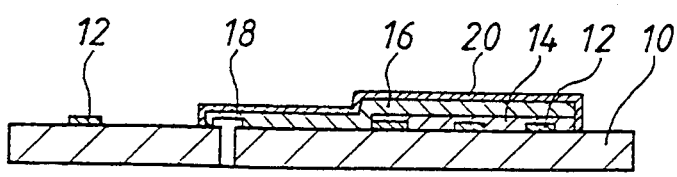
FIG. 2 is a cross-sectional view showing a part of the printed wiring board shown in FIG. 1.

Referring to FIG. 2, a printed wiring circuit 12 is formed by coating a copper foil on one surface or both surface of an insulating substrate 10 with the use of a conventional method. An insulating paste is coated on the circuit conductors 12 throughout the desired range thereof by the screen process printing or the like, thereby forming an insulating layer 14. A copper paste is coated on a part or whole surface of the insulating layer 14 by the screen process printing or the like, thereby forming a shield layer 16. In the conventional method, the shield layer 16 is coated on the whole surface of the insulating layer 14 with the use of a mask for forming the insulating layer, in order to save or omit the preparation of new additional mask. The shield layer 16 is connected to a grounded terminal 18. If necessary, a protection film 20 is coated on the shield layer 16.

The above process is well known and utilized widely. This well known method requirs a great amount of the copper paste so that the effect of heat dissipation becomes decreased. Moreover, the thickness of the copper paste becomes large so that thermal expansion and contraction become large, thereby cracking the coated film, resulting in a lack of dimensional stability.

According to the method of the present invention, the shield layer 16 is formed by halftone dots 22. In the preferred method, the halftone dots are formed by a number of dots of discontinuity. These dots of discontinuity are formed by providing copper paste on the insulating layer 14 by the screen process printing with the use of a mask in the shape of net pattern shown in FIG. 1. The pattern formed on the insulating layer 14 is a shield layer 16 consisting of a continuous fine strip and connected to a grounded terminal 18.

Alternatively, the halftone dot may be formed by a continuous netting wire from the begining, or the halftone dot may be so formed that dot arrangement of discontinuity on the mask may be formed in a pattern other than the net. In this case, the same effect may be obtained in these versions.

As described above, according to the present invention, the shield layer 16 is formed by halftone dots so that the coating film layer provided on the printed wiring circuit 12 becomes substantially decreased. Therefore, as compared with the conventional method, the desired amount of the copper paste becomes substantially decreased so that the heat dissipation effect is not obstructed, resulting in a high dimensional stability. The mask for forming halftone dot may be manufactured simply, so that the method according to the present invention may be advantageously obtained in economy and in practice.

What is claimed is:

1. A method of manufacturing a printed wiring board which comprises the steps of forming a printed circuit on a substrate, coating an insulating layer on at least a part of the printed circuit, and coating a shield layer on at least a part of the insulating layer by applying a pattern of halftone dots.

2. A method of manufacturing a printed wiring board as claimed in claim 1, wherein the pattern of halftone dots is in a shape of a netting formed in a continuous fine strip.

3. A method of manufacturing a printed wiring board as claimed in claim 1, wherein the halftone dot pattern comprises a number of discontinuous dots.

4. A method of producing a printed circuit board, comprising:
   forming a circuit on a substrate;
   covering at least a portion of the circuit with an insulating layer; and
   applying a shield layer of halftone dots on at least a portion of the insulating layer.

5. The method according to claim 4, wherein the halftone dots have a continuous net-like pattern.

6. The method according to claim 4, wherein the half-tone dots are discontinuous.

* * * * *